(12) United States Patent
Namikawa et al.

(10) Patent No.: US 9,131,829 B2
(45) Date of Patent: Sep. 15, 2015

(54) LABEL SHEET FOR CLEANING AND CONVEYING MEMBER HAVING CLEANING FUNCTION

(71) Applicant: NITTO DENKO CORPORATION, Ibaraki-shi, Osaka (JP)

(72) Inventors: Makoto Namikawa, Osaka (JP); Yoshio Terada, Osaka (JP); Jirou Nukaga, Osaka (JP); Eiji Toyoda, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/319,411

(22) Filed: Jun. 30, 2014

(65) Prior Publication Data

US 2014/0311666 A1    Oct. 23, 2014

Related U.S. Application Data

(60) Continuation of application No. 13/117,707, filed on May 27, 2011, which is a division of application No. 10/297,184, filed as application No. PCT/JP01/03850 on May 8, 2001, now abandoned.

(30) Foreign Application Priority Data

Apr. 9, 2001 (JP) ................................. 2001-109405
Apr. 10, 2001 (JP) ................................. 2001-111791

(51) Int. Cl.
  *B08B 13/00* (2006.01)
  *A47L 25/00* (2006.01)
  (Continued)

(52) U.S. Cl.
  CPC ............. *A47L 25/005* (2013.01); *B08B 7/0028* (2013.01); *B08B 13/00* (2013.01);
  (Continued)

(58) Field of Classification Search
  CPC .. B08B 13/00; B08B 7/0028; C11D 11/0058; C11D 11/0047; A47L 25/005; H01L 21/67028
  USPC .................................... 156/264, 272.2, 275.5
  See application file for complete search history.

(56) References Cited

U.S. PATENT DOCUMENTS 3,481,460 A   12/1969 Watts
3,822,492 A   7/1974 Crawley
(Continued)

FOREIGN PATENT DOCUMENTS

EP      0 774 694 A2   5/1997
EP       0930538 A1    7/1999
(Continued)

OTHER PUBLICATIONS

K. Aizawa et al., "Cleaning Sheet for Removing Stains or Dust from Solid Body Surfaces Comprises Support Coated With Adhesive Which is Cure on Contact with Stains or Dust", translation of JP 07-155704A, published on Jun. 20, 1995.
(Continued)

*Primary Examiner* — Daniel McNally
(74) *Attorney, Agent, or Firm* — Sughrue Mion, PLLC

(57) ABSTRACT

A label sheet for cleaning is formed of a label for cleaning including a cleaning layer having a 180° peeling adhesion to a silicon wafer of 0.20 N/10 mm or less after receiving an active energy and an adhesive layer provided on one of surfaces of said cleaning layer, and a separator on which the label is removably provided through the adhesive layer.

5 Claims, 4 Drawing Sheets

(51) Int. Cl.
   *B08B 7/00* (2006.01)
   *C11D 11/00* (2006.01)
   *H01L 21/67* (2006.01)

(52) U.S. Cl.
   CPC ....... *C11D 11/0047* (2013.01); *C11D 11/0058* (2013.01); *H01L 21/67028* (2013.01); *Y10T 156/1075* (2015.01); *Y10T 428/14* (2015.01); *Y10T 428/1471* (2015.01); *Y10T 428/1495* (2015.01); *Y10T 428/24752* (2015.01)

(56) References Cited

U.S. PATENT DOCUMENTS

| | | | |
|---|---|---|---|
| 3,914,483 | A | 10/1975 | Stipek, Jr. |
| 3,978,520 | A | 8/1976 | Nowicki et al. |
| 4,098,935 | A | 7/1978 | Knudsen |
| 4,150,183 | A * | 4/1979 | Reed .......................... 428/42.3 |
| 5,212,002 | A | 5/1993 | Madrzak et al. |
| 5,384,174 | A | 1/1995 | Ward et al. |
| 5,690,749 | A | 11/1997 | Lee |
| 5,759,336 | A | 6/1998 | Yamamoto et al. |
| 5,806,271 | A | 9/1998 | Van Someren et al. |
| 5,902,678 | A * | 5/1999 | Konda et al. .................. 428/345 |
| 6,001,472 | A | 12/1999 | Ikeda et al. |
| 6,030,674 | A * | 2/2000 | Onishi et al. ................. 428/40.1 |
| 6,126,772 | A | 10/2000 | Yamamoto et al. |
| 6,159,827 | A | 12/2000 | Kataoka et al. |
| 6,170,115 | B1 | 1/2001 | Tanaka et al. |
| 6,645,604 | B1 | 11/2003 | Fereshtehkhou et al. |
| 6,821,620 | B2 | 11/2004 | Namikawa et al. |
| 7,575,790 | B2 | 8/2009 | Terada et al. |
| 7,575,812 | B2 | 8/2009 | Terada et al. |
| 7,615,288 | B2 | 11/2009 | Terada et al. |
| 7,712,177 | B2 | 5/2010 | Yoshida et al. |
| 7,713,356 | B2 | 5/2010 | Namikawa et al. |
| 7,718,255 | B2 | 5/2010 | Namikawa et al. |
| 7,793,668 | B2 | 9/2010 | Namikawa et al. |
| 7,824,752 | B2 | 11/2010 | George |
| 7,846,258 | B2 | 12/2010 | Terada et al. |
| 8,048,690 | B2 | 11/2011 | Terada et al. |
| 8,323,761 | B2 | 12/2012 | Nakayama et al. |
| 8,371,316 | B2 | 2/2013 | Humphrey et al. |
| 8,460,783 | B2 | 6/2013 | Namikawa et al. |
| 2002/0112300 | A1 * | 8/2002 | Muhr-Sweeney ....... 15/104.002 |
| 2003/0051382 | A1 | 3/2003 | Sinato |
| 2003/0136430 | A1 | 7/2003 | Namikawa et al. |
| 2003/0180532 | A1 | 9/2003 | Namikawa et al. |
| 2004/0005428 | A1 | 1/2004 | Katoh et al. |
| 2004/0018329 | A1 | 1/2004 | Katoh et al. |
| 2010/0170533 | A1 | 7/2010 | Terada et al. |

FOREIGN PATENT DOCUMENTS

| | | | |
|---|---|---|---|
| GB | 2 298 807 | A | 9/1996 |
| GB | 2322006 | A | 8/1998 |
| JP | 06-018383 | Y2 | 5/1994 |
| JP | 08-088208 | | 4/1996 |
| JP | 08-115897 | | 5/1996 |
| JP | 08-115897 | A | 5/1996 |
| JP | 08-203857 | | 8/1996 |
| JP | 08-203857 | A | 8/1996 |
| JP | 10-154686 | A | 6/1998 |
| JP | 11-087458 | A | 3/1999 |
| JP | 11-224414 | | 8/1999 |
| JP | 11-224414 | A | 8/1999 |
| JP | 11224414 | A * | 8/1999 |
| JP | 2000-221888 | A | 8/2000 |
| JP | 2000-312862 | | 11/2000 |
| JP | 2000-312862 | A | 11/2000 |
| JP | 2000312862 | A * | 11/2000 |
| WO | 00/67924 | | 11/2000 |
| WO | 00/67924 | A1 | 11/2000 |
| WO | WO 0067924 | A1 * | 11/2000 |

OTHER PUBLICATIONS

Istvan Benedek et al., "Pressure-sensitive adhesives technology", 1997, Marcel Dekker Inc., Chapter 7, pp. 262-263.
Chikada et al., "Method of Removing Foreign Substances Adhered on a Semiconductor Wafer", English translation of JP 08-107098, published on Apr. 23, 1996.
Chikada et al., "Adhesive Tape for Removing Alien Substances Adhered on a Semiconductor Wafer and the Removal Method", English translation of JP 08-124892, published on May 17, 1996.
Midori Chikada et al., "Adhesive Tape for Removing Alien Substances Adhered on a Semiconductor Wafer and a Removal Method", English translation of JP 08-088208, published on Apr. 2, 1996.
Yasu Chikada et al., "Adhesive Tape and Method for Removing Foreign Matter Adhering to Semiconductor Wafer", Machine Translation of JP 08-088208, Apr. 2, 1996.
Y. Chikada et al., "Pressure sensitive adhesive tape and label has adhesive layer on support film, having pattern generally same shape as of semiconductor wafer, for removing foreign matter stuck on semiconductor wafer", Machine translation of JP 08-097179, published Apr. 12, 1996.
Yasu Chikada et al., "Adhesive Tape, Label, and Removal Method for Removal of Foreign Material Adhering to Semiconductor Wafer", English translation of JP 08097179, published on Apr. 12, 1996.
Rajiv Kohli and Kashmiri L. Mittal (Ed.), "Developments in Surface Contamination and Cleaning", 2010, Elsevier, Chapter 5, pp. 191-192.
Definition of "curing" from Free Online Dictionary, retrieved on Feb. 17, 2014.
Definition of "trench" from Free Online Dictionary, retrieved on Feb. 18, 2014.
Makoto Namikawa et al., "Cleaning Sheet", English translation of JP 2000-312862, published Nov. 14, 2000.
Makoto Namikawa et al., "Label Sheet for Cleaning and Conveying Member Having Cleaning Function", abstract of WO 00/2083332, published on Oct. 24, 2002.
Office Action issued in Japanese Patent Application No. 2001-109405 on Mar. 13, 2007.
Office Action issued in Japanese Patent Application No. 2001-111791 on Feb. 18, 2008.
Office Action issued in related U.S. Appl. No. 10/297,184 on May 16, 2011.
Office Action issued in related U.S. Appl. No. 10/297,184 on Oct. 13, 2011.
Office Action issued in related U.S. Appl. No. 13/117,842 on Feb. 14, 2012.
Office Action issued in related U.S. Appl. No. 13/117,842 on Jul. 19, 2012.
Office Action issued in related U.S. Appl. No. 10/297,184 on Sep. 6, 2012.
Office Action issued in related U.S. Appl. No. 13/117,842 on Jan. 22, 2013.
Office Action issued in related U.S. Appl. No. 10/297,184 on Mar. 13, 2013.
Office Action (Advisory Action) issued in related U.S. Appl. No. 13/117,842 on May 14, 2013.
Office Action issued in related U.S. Appl. No. 13/117,842 on Jul. 18, 2013.
Office Action issued in related U.S. Appl. No. 10/297,184 on Aug. 16, 2013.
Office Action issued in related U.S. Appl. No. 13/117,842 on Mar. 11, 2014.
Masanori Sano et al., "Cleaning tape of sheet for a machine", English translation of JP 11-224414A, published on Aug. 17, 1999.
Donatas Satas, "Handbook of Pressure Sensitive Adhesive Technology", 1999, Satas & Associates, 3rd edition, pp. 458-465.
Masashi Yamamoto et al., "Adhesive Label Sheet for Semiconductor Wafer", machine translation of Japanese Patent Application No. 2000-221888, published on Aug. 11, 2000.
Office Action dated Jul. 23, 2014, issued by the U.S. Patent and Trademark Office in U.S. Appl. No. 13/117,707.

(56) References Cited

OTHER PUBLICATIONS

Notification of Reasons for Refusal dated Feb. 26, 2008, issued by the Japanese Patent Office in Japanese Patent Application No. 2001-111791.
Office Action dated Nov. 17, 2014, issued by the U.S. Patent and Trademark Office in co-pending U.S. Appl. No. 13/117,707.
Office Action dated Nov. 20, 2014, issued by the U.S. Patent and Trademark Office in co-pending U.S. Appl. No. 14/319,416.
Office Action dated Apr. 16, 2015, issued by the United States Patent and Trademark Office in co-pending U.S. Appl. No. 14/319,416.
Office Action dated May 21, 2015, issued by the U.S. Patent and Trademark Office in copending U.S. Appl. No. 13/117,707.

* cited by examiner

LABEL SHEET FOR CLEANING AND CONVEYING MEMBER HAVING CLEANING FUNCTION

This is a continuation of application Ser. No. 13/117,707 filed May 27, 2011, which is a divisional of application Ser. No. 10/297,184 filed Dec. 3, 2002, which is a national stage of PCT/JP01/03850 filed May 8, 2001, which claims priority from Japanese Patent Application No. 2001-109405 filed Apr. 9, 2001 and Japanese Patent Application No. 2001-111791 filed Apr. 10, 2001. The entire disclosures of the prior applications are hereby incorporated by reference.

TECHNICAL FIELD

The present invention relates to a label sheet for cleaning equipment, and a label sheet for cleaning on a conveying member for use in a clean substrate processing apparatus, for example, manufacturing equipment or checking equipment for a semiconductor, a flat panel display or a printed board.

BACKGROUND ART

Various forms of substrate processing equipment utilize a conveying system to convey a substrate in physical contact with the conveying system. In this case, if foreign matters stick to the substrate or the conveying system, succeeding substrates are successively contaminated. Therefore, it is necessary to periodically stop the equipment to carry out a washing process. For this reason, there is a problem in that an availability factor of the equipment is reduced and a great deal of labor is required. In order to solve the problem, there have been proposed: (1) a method of removing foreign matter sticking on portions of a substrate processing equipment by conveying a substrate having an adhesive substance fastened thereto (for example, Unexamined Japanese Patent Publication 10-154686); and (2) a method of removing foreign matter sticking to the back face of a substrate by conveying a plate-shaped member (Unexamined Japanese Patent Publication 11-87458).

Of these methods, the method of removing foreign matter by conveying a plate-shaped member allows easy conveyance of the plate-shaped member, but is relatively less effective in cleaning foreign matter.

In contrast, the method of removing foreign matter by conveying a substrate having an adhesive substance fastened thereto is relatively more effective in cleaning foreign matter. However, there is a possibility that the adhesive substance and a portion of the equipment might be bonded too strongly to be removed. Therefore, the substrate might not be conveyed reliably. In particular, when a pressure reducing absorption mechanism is used for a chuck table of the equipment, this problem is prevalent.

Further, when the adhesive substance (i.e., the cleaning sheet) is fastened to the substrate, there has been known a method of bonding a cleaning sheet that is larger in size than the substrate to the substrate, and then cutting the cleaning sheet along the shape of the substrate (i.e., a direct cutting method). However, in such a method, refuse from the cut away portion might be generated and might stick to the substrate or the equipment.

Alternatively, another method of bonding a cleaning sheet to a substrate is known where the cleaning sheet is previously punched to the shape of the substrate before being fastened to the substrate (i.e., a precutting method). In this case, the generation of refuse is reduced as compared to the direct cutting method. In some cases, however, an adhesive of the cleaning sheet might leak out of a punched surface during the sheet punching and might stick to an end of the cleaning sheet or substrate so that an appearance is deteriorated or conveyance troubles are caused. Furthermore, in the case in which an adhesive of a polymerization and curing type is used, the adhesive on the end of the cleaning sheet causes defective curing by polymerization inhibition due to oxygen inhibition if the curing is carried out after the sheet punching. Therefore, the contact portion of the substrate processing equipment might be contaminated by the adhesive.

SUMMARY OF THE INVENTION

In view of the above, it is an object of the invention to provide a label sheet for cleaning which: can be reliably conveyed on a substrate in substrate processing equipment; removes foreign matter sticking in the equipment easily and reliably; enhances a working efficiency; and generates no refuse because sheet cutting is not required after bonding to the substrate.

It is another object of the invention to provide a method of manufacturing a label sheet for cleaning which: can be reliably conveyed on a substrate in substrate processing equipment; removes foreign matters sticking into the equipment easily and reliably; and results neither in defective punching during sheet punching nor in defective adhesive curing in a precutting method.

In one aspect of the invention, when the cleaning sheet or the substrate having the sheet fastened thereto is conveyed to remove foreign matter sticking in substrate processing equipment, setting an adhesion to a specific value or less using an active energy source and setting the cleaning sheet to have the label shape results in easy and reliable removal of the foreign matter without the troubles described above.

In another aspect of the invention, a label for cleaning including an ordinary adhesive layer on one surface having a 180° peeling adhesion to a silicon wafer (mirror surface) of 0.20 N/10 mm or less, after receiving an active energy, is removably provided on a separator through the ordinary adhesive layer.

In another aspect of the invention, the label sheet also may be constituted such that the cleaning layer is provided on a surface of a base material, an ordinary adhesive layer is provided on the other surface, and the label sheet is removably provided on a separator through the ordinary adhesive layer.

In another aspect of the invention, a plurality of the labels for cleaning may be continuously provided on an elongated separator at regular intervals.

In another aspect of the invention, a label sheet for cleaning is provided on a conveying member, where the label sheet for cleaning has a smaller size than that of the conveying member. Further, the label sheet may be shaped so as not to protrude from an end of the conveying member.

In another aspect of the invention, a method of manufacturing a label sheet for cleaning is provided in which a cleaning layer formed of an adhesive is provided on one surface of a base material with a surface thereof protected by a removable film, and the other surface of the base material is removably provided on a separator through an ordinary adhesive layer, wherein the cleaning layer is a curing type adhesive which is polymerized and cured upon receipt of an active energy and the step of punching a sheet to have a shape of the label is carried out after a polymerization and curing reaction of the adhesive of the cleaning layer.

BRIEF DESCRIPTION OF THE DRAWINGS

The above and other objects, features and advantages of the invention will be evident from the following detailed descrip

DETAILED DESCRIPTION OF EXEMPLARY EMBODIMENTS OF THE INVENTION

Figure 1:
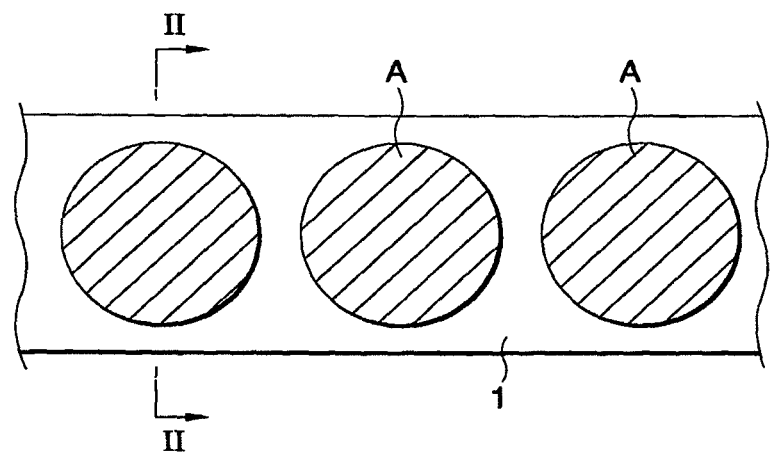
- FIG. 1 is a partial plan view showing an exemplary embodiment of a label sheet for cleaning according to the invention.

Exemplary embodiments of the invention will now be described below by reference to the attached Figures. The described exemplary embodiments are intended to assist the understanding of the invention, and are not intended to limit the scope of the invention in any way.

According to an exemplary embodiment of the invention, in a label sheet for cleaning, a cleaning layer (which hereinafter may include such configurations as a single cleaning sheet, a laminated sheet or a laminated sheet with a base material) is cured by an active energy source (e.g., ultraviolet rays and/or heat), resulting in a reduction in adhesion. As a result, a 180° peeling adhesion to a silicon wafer (mirror surface) of the cleaning layer is set to 0.20 N/10 mm or less, and more preferably, but not necessarily, is set to approximately 0.010 to 0.10 N/10 mm. When the adhesion exceeds 0.20 N/10 mm, the cleaning layer might be bonded to a portion to be cleaned in the equipment during conveyance therein, which would result in conveyance troubles. Moreover, while the thickness of the cleaning layer is not particularly restricted, it is usually set to be approximately 5 to 100 µm.

According to another exemplary embodiment of the invention, the cleaning layer has a modulus of tensile elasticity (in accordance with a test method JIS K7127) of 0.98 N/mm$^2$ or more and more preferably, but not necessarily, 9.8 to 980 N/mm$^2$. If the modulus of tensile elasticity is set in this manner, a substrate can be conveyed more reliably in processing equipment.

According to another exemplary embodiment of the invention the cleaning layer should have a surface resistivity of 1×10$^{13}$Ω/□ or more and more particularly, but not necessarily, 1×10$^{14}$Ω/□ or more. If the surface resistivity of the cleaning layer is set in this manner, it is possible to obtain the effect that foreign matter can be captured and adsorbed through static electricity in addition to the adhesion thereof. Accordingly, in another exemplary embodiment, the cleaning layer does not include a conductive substance such as an additive having a conducting function.

According to another exemplary embodiment of the invention, a curing type adhesive which is polymerized and cured upon receipt of an active energy is used for the cleaning layer.

Consequently, tackiness of the cleaning layer is substantially eliminated so that the cleaning layer is not strongly bonded to the equipment when a conveying member having a cleaning function is conveyed. Thus, it is possible to provide the conveying member having a cleaning function which can be conveyed reliably.

According to another exemplary embodiment of the invention, the cleaning layer has such a property that it is cured by the active energy source to cause a molecular structure to have a three-dimensional network. As long as such a result is achieved, the material of which the cleaning layer is constructed is not particularly restricted. For example, the cleaning layer may be formed of an adhesive layer obtained by a pressure-sensitive adhesive polymer containing a compound having one or more unsaturated double bonds in a molecule. Examples of such a pressure-sensitive adhesive polymer include an acryl based polymer containing, as a principal monomer, (metha)acrylic acid and/or (metha)acrylic ester selected from acrylic acid, acrylic ester, methacrylic acid and ester methacrylate. A compound having two or more unsaturated double bonds in a molecule is used as a copolymerized monomer in the synthesis of the acryl based polymer or a compound having an unsaturated double bond in a molecule is chemically bonded to the acryl based polymer with a reaction between functional groups after the synthesis so that the unsaturated double bond is introduced into the molecule of the acryl based polymer. Consequently, a polymer itself can also be related to a polymerization and curing reaction with an active energy.

In this regard, a compound having one or more unsaturated double bonds in a molecule (which will be hereinafter referred to as a polymerized and unsaturated compound) should be a low molecular weight compound which is non-volatile and has a weight average molecular weight of 10,000 or less, and particularly, should have a weight average molecular weight of 5,000 or less such that the three-dimensional network of an adhesive layer can be obtained efficiently during curing. Examples of such a polymerized compound include phenoxypolyethyleneglycol(metha)acrylate, ε-caprolacton(metha)acrylate, polyethyleneglycol di(metha)acrylate, polypropyleneglycol di(metha)acrylate, trimethylolpropane tri(metha)acrylate, dipentaerythritol hexa(metha)acrylate, urethane(metha)acrylate, epoxy(metha)acrylate and oligoester (metha)acrylate, and one or more of them are used.

Moreover, a polymerization initiator to be added to the cleaning layer is not particularly restricted and a well-known polymerization initiator can be used. For example, in the case in which heat is used for the active energy source, a thermal polymerization initiator such as benzoyl peroxide or azobisisobutylonitoryl is applied. In the case in which light is used for the active energy source, a photopolymerization initiator such as benzoyl, benzoyl ethylether, dibenzyl, isopropylbenzoyl ether, benzophenone, Michler's ketone chlorothioxanthone, dodecylthioxanthone, dimethylthioxanthone, acetophenone diethylketal, benzyldimethylketal, α-hydroxycyclohyxyl phenylketone, 2-hydroxydimethyl phenylpropane or 2,2-dimethoxy-2-phenylacetophenone.

The label sheet for cleaning according to another exemplary embodiment of the invention comprises a label for cleaning including the specific cleaning layer on one of surfaces of a base material and an ordinary adhesive layer on the other surface of the base material. Further, the label sheet is removably provided on a separator through the ordinary adhesive layer. In such an embodiment, as long as the ordinary adhesive layer satisfies the adhesion function, a material thereof is not particularly restricted and an ordinary adhesive (for example, an acryl based adhesive or a rubber based adhesive) can be used. Further, in such an embodiment, the label sheet is removed from a separator (which will be described below), is bonded to a conveying member such as a substrate through the ordinary adhesive layer, and is conveyed as a conveying member having a cleaning function into a piece of equipment to come in contact with a portion to be washed. Thus, the cleaning can be carried out.

In this embodiment, while the base material is not particularly restricted, examples thereof include a plastic film such as polyethylene, polyethylene terephthalate, acetyl cellulose, polycarbonate, polypropylene or polyamide. A thickness of the base material is usually set to approximately 10 to 100 µm.

In this embodiment, as long as the label for cleaning can be removed, the separator according to the invention is not particularly restricted and examples thereof include polyolefin such as polyester, polypropylene, polybutene, polybutadiene or polymethyl pentene which is removed with a silicone based, long chain alkyl based, fluorine based, fatty acid amide based or silica based remover, and a plastic film formed of polyvinyl chloride, vinyl chloride copolymer, polyethylene terephthalate, polybutylene terephthalate, polyurethane, ethylene-vinylacetate copolymer, ionomer resin, ethylene-(metha)acrylate copolymer, ethylene-(metha)acrylic ester compolymer, polystyrene or polycarbonate.

According to another exemplary embodiment of the invention, when the label sheet is designed to be conveyed in a piece of equipment on a substrate, and when the label sheet is removed from the adhesive layer after the cleaning in order to recycle the substrate, the ordinary adhesive layer should have a 180° peeling adhesion for a silicon wafer (mirror surface) of approximately 0.01 to 0.98 N/10 mm, and more particularly, but not necessarily, approximately 0.01 to 0.5 N/10 mm. When the peeling adhesion is set in this manner, the substrate is not separated from the label sheet during conveyance, but can be easily removed therefrom after the cleaning.

In the embodiments described herein, the conveying member to which the label for cleaning is to be bonded is not particularly restricted. Examples of the conveying member include a semiconductor wafer, a substrate for a flat panel display such as an LCD or a PDP and a substrate for a compact disk or an MR head.

The exemplary embodiments of the invention will now be described with specific reference to the attached drawings, and in view of the exemplary embodiments described above.

Figure 2:
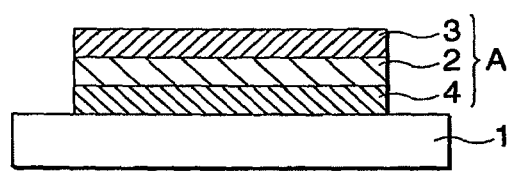
FIG. 2 is a sectional view taken along a line II-II of FIG. 1.

FIG. 1 is a plan view showing an exemplary embodiment of a label sheet for cleaning according to the invention in which a plurality of labels A for cleaning are continuously provided on an elongated separator 1 at regular intervals. The label A includes a cleaning layer 3 on one of surfaces of a base material 2 and an ordinary adhesive layer 4 on the other surface, as shown in FIG. 2 (a sectional view taken along a line II-II in FIG. 1), and is removably provided on the separator 1 through the adhesive layer 4.

During use, the label for cleaning is removed from the separator 1, is bonded to a conveying member such as a semiconductor wafer, and is conveyed into a piece of equipment. Consequently, a portion to be washed can be cleaned.

Figure 3:
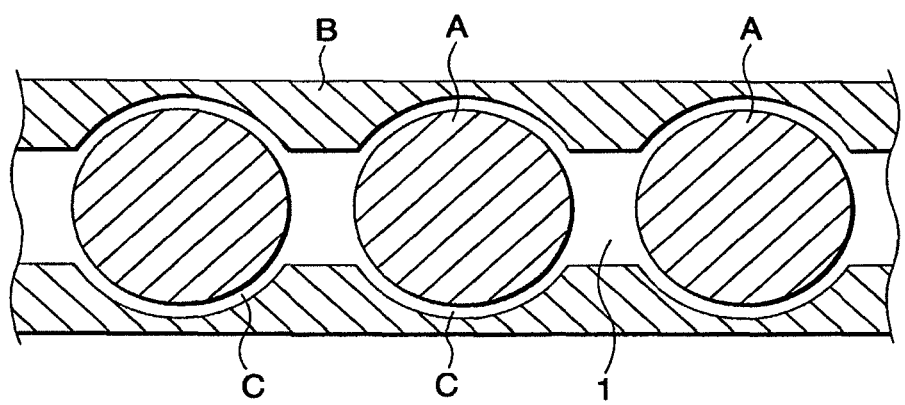
FIG. 3 is a partial plan view showing another exemplary embodiment of a label sheet for cleaning according to the invention.

FIG. 3 is a plan view showing another exemplary embodiment of the label sheet for cleaning according to the invention in which a reinforcing portion B is formed along the periphery of label A, separated therefrom by a trench-shaped concave portion C. Since the reinforcing portion B is provided, an excellent handling property can be obtained when the label sheet for cleaning is a roll-shaped substance or a sheet laminator, and the label for cleaning can be smoothly removed from a separator during use so that an excellent labeling reliability can also be obtained. In this embodiment, the shapes of the labels A and reinforcing portions B may be obtained by punching and removing an unnecessary part to form the concave portion C. In this case, the concave portions C may be continuously provided with each other to allow consecutive removal. Alternatively, a part of the periphery of the label A may be only a nick portion so that the label A and the reinforcing portion B may be provided partially in contact with each other.

Figure 4:
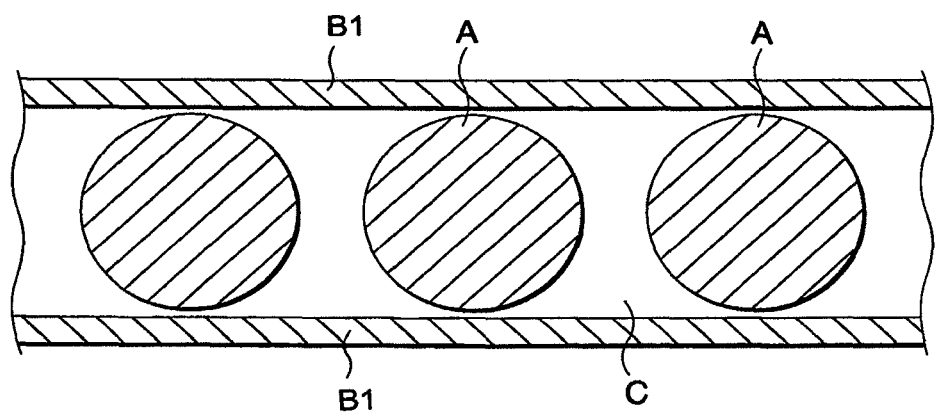
FIG. 4 is a partial plan view showing yet another exemplary embodiment of a label sheet for cleaning according to the invention.

FIG. 4 is a plan view showing another exemplary embodiment of the label sheet for cleaning according to the invention in which a band-shaped reinforcing portions B1 can be continuously provided on both transverse sides of the separator 1. The reinforcing portions B1 are formed linearly in parallel with the side of the separator. The reinforcing portions B1 and the label A may be separated at regular intervals from each other on one or both sides of the separator 1 so that the unnecessary parts can be consecutively removed during the manufacture of the sheet. However, the reinforcing portions B1 and the label A on may also be provided in contact with each other.

Figure 5:
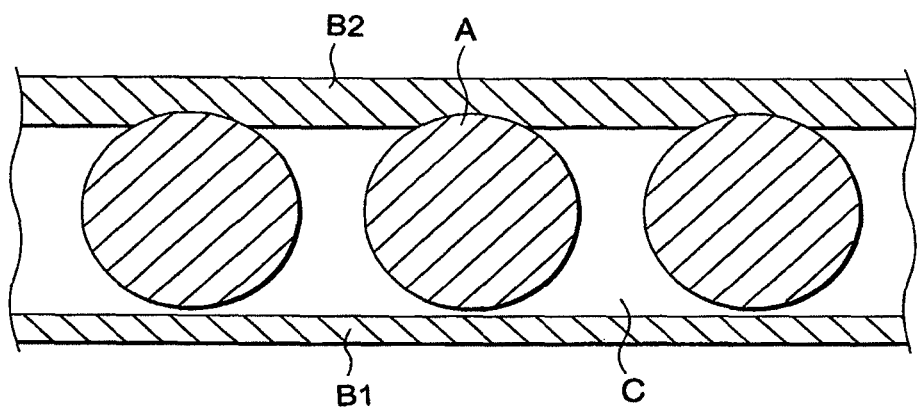
FIG. 5 is a partial plan view showing a further exemplary embodiment of a label sheet for cleaning according to the invention.

FIG. 5 is a plan view showing another exemplary embodiment of the label sheet for cleaning according to the invention in which a wider reinforcing portion B2 on one side of the separator 1 is formed to have a greater width such that the reinforcing portion B1 provided on the opposite side of the separator. The wider reinforcing portion B2 comes in contact with a part of the outer periphery of the label A. Consequently, it is possible to further enhance the effect of reinforcing the end of the label sheet without damaging the continuous removal of the unnecessary part.

While the shape of the reinforcing portion B is not particularly restricted and can be properly provided continuously or discontinuously, a continuous reinforcing portion B prevents refuse from entering through the sides of the separator 1. Further, although the thickness of the reinforcing portion B is not particularly restricted, the thickness may be almost equal to that of the label A in consideration of the roll-shaped or laminated label sheet. Still further, the width of the reinforcing portion B is not particularly restricted and can be properly set in consideration of the width of the separator and the diameter of the label. If the width is set to be as great as possible, the reinforcing effect can be increased.

A method of manufacturing the label sheet for cleaning according to the invention is not particularly restricted. Such a method may include, for example, bonding an adhesive film constituting the label and the reinforcing portion (in which a cleaning layer is provided on one of surfaces of a base material and an ordinary adhesive layer is provided on the other surface) onto the separator. Next, only the adhesive film is punched to form the shape(s) of the label and/or reinforcing portion simultaneously or separately so that an unnecessary adhesive film can be separated and removed from the separator. In this case, the concave portion (e.g., C) may be provided continuously to allow the unnecessary adhesive film to be removed consecutively. In such a process, the cutting method or the processing configuration is not particularly restricted. Then, the unnecessary adhesive film is usually wound onto an optional core to be roll-shaped.

In another exemplary embodiment of the label sheet for cleaning according to the invention, a curing type adhesive for polymerizing and curing a cleaning layer upon receipt of an active energy may be used and the step of cutting the sheet to have the shape of the label should be carried out after the polymerization and curing reaction of the adhesive of the cleaning layer. If the adhesive constituting the cleaning layer is neither polymerized nor cured during the sheet cutting, an adhesive layer constituting the cleaning layer may protrude from a cut end and bond to a cut surface, the adhesive may rope, a cutting depth may become nonuniform, or a cut surface may be roughened. In the worst case, defective cutting might be caused. Furthermore, when the polymerization and curing reaction is carried out after the sheet cutting, the adhesive facing a cut portion is inhibited from being polymerized due to oxygen inhibition, which may consequently result in the substrate processing equipment being contaminated by the adhesive.

In another exemplary embodiment of the label sheet for cleaning according to the invention, the cleaning layer has a modulus of tensile elasticity (in accordance with a test method JIS K7127) of 10 N/mm² or more and preferably 10 to 2000 N/mm² such that troubles are not made during the sheet cutting. If the modulus of tensile elasticity is set to have such a specific value or more, it is possible to better prevent the adhesive from leaking out of the cleaning layer or a defective cutting from being caused during the sheet cutting. Thus, it is possible to manufacture a label sheet for cleaning which is not contaminated by the adhesive in the precutting method. If the modulus of tensile elasticity is smaller than 10 N/mm², the troubles might occur during the sheet cutting or conveyance troubles might occur due to bonding of the adhesive to a portion to be cleaned in the equipment during the conveyance. On the other hand, if the modulus of tensile elasticity is too great, the performance for removing foreign matters sticking onto a conveying system might be deteriorated.

Figure 6:
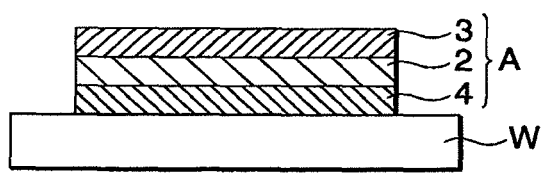
FIG. 6 is a sectional view showing another exemplary embodiment of a conveying member having a cleaning function according to the invention.

FIG. 6 shows an exemplary embodiment of the invention where a label A for cleaning is provided on a conveying member W, such as a wafer, so that the shape of the label A is smaller than that of the conveying member W and is not protruded from the end of the conveying member W. The label A includes a cleaning layer 3 on one of surfaces of a base material 2 and an ordinary adhesive layer 4 on the other surface, and is provided on the conveying member W through the adhesive layer 4.

Providing a label that is smaller and/or does not protrude from a conveying member is advantageous because, if the cleaning sheet is larger than the conveying member and/or is protruded from the conveying member, the cleaning sheet may be caught in a conveying member accommodating cassette or a conveyance path so that it is turned over and shifted. In the worst case, there is a possibility that the conveyance might not be carried out. Further, the label sheet might even be caught in the conveying member accommodating cassette even if the shape of the cleaning sheet is the same as that of the conveying member. Only in the case in which the shape of the cleaning sheet is smaller than that of the conveying member, can these problems be totally avoided so that the conveying member having a cleaning function can be conveyed reliably. While the degree of smallness is not particularly restricted, an effective area required for removing foreign matters is reduced if the cleaning sheet is too small. Therefore, a size of approximately 5 mm is practically required at a minimum.

Figure 7:
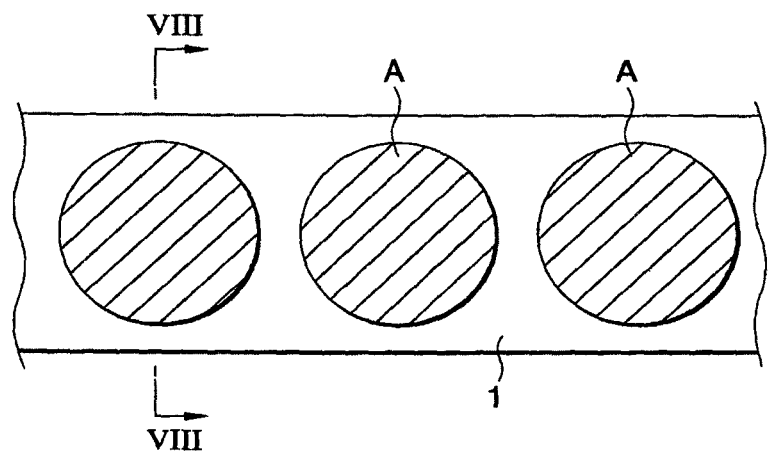
FIG. 7 is a partial plan view showing another exemplary embodiment of a label sheet for cleaning according to the invention.
Figure 8:
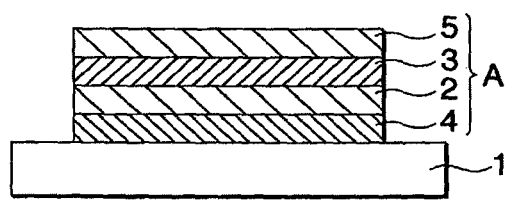
FIG. 8 is a sectional view taken along a line VIII-VIII of FIG. 7.

FIG. 7 is a plan view showing another example of a label sheet for cleaning according to the invention wherein a plurality of labels A for cleaning continuously provided on an elongated separator 1 at regular intervals. As described above, the shape of the label A may be smaller than that of the conveying member W of FIG. 6. In this case, the label A includes a cleaning layer 3 on one of surfaces of a base material 2, a separating film 5 on a surface thereof, and an ordinary adhesive layer 4 on the other surface as shown in FIG. 8 (a sectional view taken along a line VIII-VIII in FIG. 7) and is removably provided on the separator 1 through the adhesive layer 4.

During use, the label A for cleaning is removed from the separator 1 and is bonded to the conveying member W (such as a semiconductor wafer), and furthermore, the separating film 5 is removed and the label A for cleaning is thus conveyed into a piece of equipment. Consequently, a portion to be washed can be cleaned.

In the embodiments described herein, the shape of the label A is not particularly restricted. The label A may be a circular shape, a wafer shape, a frame shape, or a shape having a protruded part for a chuck portion, depending on the shape of the conveying member such as, for example, a substrate to be bonded. Further, as described above, the label A may be smaller than the shape of the conveying member W.

The invention will be further described below based on a discussion of three example constructions, along with comparisons thereto. These examples should not be read as restricting the invention in any way. In the following description, a "part" represents a "part by weight".

First Example

An adhesive solution of an ultraviolet curing type was prepared by uniformly mixing 50 parts by weight of polyethyleneglycol dimethacrylate, 50 parts by weight of urethane acrylate, 3 parts by weight of benzyldimethyl ketal and 3 parts by weight of diphenylmethane diisocyanate with 100 parts by weight of acryl based polymer (a weight average molecular weight of 700000) obtained by a monomer mixed solution containing 75 parts by weight of acrylic acid-2-ethylhexyl, 20 parts by weight of methyl acrylate and 5 parts by weight of acrylic acid.

Additionally, an ordinary adhesive solution was prepared in the same manner as described above except that the benzyldimethyl ketal was excluded from the adhesive.

The ordinary adhesive solution was coated to have a thickness of 10 µm after drying over the removed surface of a separator formed of an elongated polyester film (with a thickness of 38 µm and a width of 250 mm) having one surface treated with a silicone based remover. An elongated polyolefin film (with a thickness of 25 µm and a width of 250 mm) was then provided on the ordinary adhesive layer, and an adhesive solution of an ultraviolet curing type was coated over the polyolefin film to have a thickness of 40 µm after drying. Thus, a sheet was obtained.

Ultraviolet rays having a central wavelength of 365 nm were irradiated on the sheet with an integral light quantity of 1000 mJ/cm² so that a sheet for cleaning having a cleaning layer cured by the ultraviolet rays was obtained.

The top portion of the sheet (other than the separator) was punched to form a circle having a diameter of 200 mm, and an unnecessary part of the sheet was continuously separated and removed. Thus, the label sheet for cleaning according to the exemplary embodiment of the invention shown in FIG. 1 was fabricated.

A cleaning layer of the cleaning sheet was bonded to the mirror surface of a silicon wafer with a width of 10 mm and a 180° peeling adhesion to the silicon wafer was measured in accordance with JIS Z0237. As a result, a 180° peeling adhesion of 0.078 N/10 mm was measured.

The cleaning layer of the cleaning sheet had a modulus of tensile elasticity of 49 N/mm². The modulus of tensile elasticity was measured in accordance with a test method JIS K7127.

Moreover, a surface resistivity was measured over the cleaning layer with surface resistivity measuring equipment (produced by Mitsubishi Chemical Corporation, Type of MCP-UP450) at a temperature of 23° C. and a humidity of 60% RH. As a result, $9.99 \times 10^{13} \Omega/\square$ or more was obtained and the measurement could not be carried out.

A label for cleaning was removed from the separator and was bonded to the back face (mirror surface) of a silicon wafer having a size of 8 inches with a hand roller. Thus, a cleaning wafer for conveyance having a cleaning function was fabricated.

Then, two wafer stages of the substrate processing equipment were removed and foreign matters having a size of 0.3 μm or more were measured through lasertype foreign matter measuring equipment. 20000 foreign matters were measured in an area having a wafer size of 8 inches and 18000 foreign matters were measured in another area.

Next, the cleaning wafer was conveyed into the substrate processing equipment having the wafer stage to which the 20000 foreign matters stuck. The conveyance could be carried out without a hindrance. Then, the wafer stage was removed and the foreign matters having a size of 0.3 μm or more were again measured through the laser type foreign matter measuring equipment. 3950 foreign matters were measured within a wafer size of 8 inches. Thus, ¾ or more of the foreign matter which stuck before the cleaning were removed.

Comparative Example 1

A cleaning sheet was fabricated in the same manner as that in the first embodiment except that ultraviolet rays having a central wavelength of 365 nm were irradiated with an integral light quantity of 150 mJ/cm². An adhesion to a silicon wafer was measured. As a result, an adhesion of 0.33 N/10 mm was obtained.

A cleaning wafer for conveyance which was fabricated from the cleaning sheet in the same method as that in the embodiment was conveyed into a substrate processing equipment having a wafer stage to which 18000 foreign matters stuck. As a result, the cleaning wafer was fastened to the wafer stage and could not be conveyed.

Second Example

An adhesive solution of an ultraviolet curing type was prepared by uniformly mixing 50 parts by weight of polyethyleneglycol 200 dimethacrylate (produced by SHIN-NAKAMURA CHEMICAL CO., LTD: trade name of Nk Ester 4G), 50 parts by weight of urethane acrylate (produced by SHIN-NAKAMURA CHEMICAL CO., LTD: trade name of U-N-01), 3 parts by weight of polyisocyanate compound (produced by NIPPON POLYURETHANE INDUSTRY CO., LTD: trade name of Colonate L) and 3 parts by weight of benzyldimethyl ketal as a photopolymerization initiator (produced by CIBA SPECIALTY CHEMICALS K.K.: trade name of Irugacure-651) with 100 parts by weight of acryl based polymer (a weight average molecular weight of 700000) obtained by a monomer mixed solution containing 75 parts by weight of acrylic acid-2-ethylhexyl, 20 parts by weight of methyl acrylate and 5 parts by weight of acrylic acid.

Additionally, an ordinary adhesive solution was obtained in the same manner as described above except that the benzyldimethyl ketal was excluded from the adhesive.

The ordinary adhesive solution was coated to have a thickness of 10 μm after drying over the removed surface of a separator formed of an elongated polyester film (with a thickness of 38 μm and a width of 250 mm) having one surface treated with a silicone based remover. An elongated polyester film (with a thickness of 25 μm and a width of 250 mm) was provided on the ordinary adhesive layer, and an adhesive solution of an ultraviolet curing type was coated over the polyester film to have a thickness of 40 μm after drying. Thus, an adhesive layer was provided as a cleaning layer, and a removing film formed of the elongated polyester film (with a thickness of 38 μm and a width of 250 mm), having one of surfaces treated with a silicone based remover, was bonded to the surface of the adhesive layer. Thus, a sheet was obtained.

Ultraviolet rays having a central wavelength of 365 nm were irradiated on the sheet with an integral light quantity of 1000 mJ/cm² so that a sheet for cleaning having a cleaning layer cured by the ultraviolet rays was obtained.

The top portion of the sheet (other than the separator) was punched to form a circle having a diameter of 198 mm, and an unnecessary part of the sheet was continuously separated and removed. Thus, the label sheet for cleaning according to the exemplary embodiment of the invention shown in FIG. 7 was fabricated. Moreover, the cleaning layer of the label sheet for cleaning had a modulus of tensile elasticity of 49 N/mm² after the curing through the irradiation of the ultraviolet rays. The modulus of tensile elasticity was measured in accordance with a test method JIS K7127.

The label for cleaning was removed from the separator of the label sheet for cleaning thus obtained and was bonded to the back face (mirror surface) of a silicon wafer having a size of 8 inches (200 mm) with a hand roller. Thus, a cleaning wafer for conveyance having a cleaning function was fabricated.

By using the label sheet for cleaning, the label was bonded to the back face (mirror surface) of the silicon wafer having a size of 8 inches through a label tape bonding machine (produced by NITTO SEIKI INC.: trade name of NEL-GR3000). This operation was carried out continuously for 25 sheets. As a result, the sheet could be bonded to the wafer without a problem. Thus, a cleaning wafer for conveyance having a cleaning function could be fabricated. Moreover, the cleaning wafer for conveyance having a cleaning function thus obtained was confirmed, and it was found that all the label sheets are bonded to the inside of the silicon wafer and were not protruded from the end of the wafer.

Moreover, the cleaning layer was bonded to the mirror surface of the silicon wafer with a width of 10 mm and a 180° peeling adhesion to the silicon wafer was measured in accordance with JIS Z0237. As a result, the 180° peeling adhesion to the silicon wafer was 0.078 N/10 mm.

On the other hand, foreign matters having a size of 0.2 μm or more were measured over the mirror surfaces of two brand-new silicon wafers having a size of 8 inches through a laser type foreign matter measuring equipment. Consequently, a first wafer had six foreign matters and a second wafer had five foreign matters. After the wafers are conveyed to a substrate processing equipment having separate electrostatic adsorbing mechanisms with the mirror surfaces put on the underside and the foreign matters having a size of 0.2 μm or more were measured through the laser type foreign matter measuring equipment. Consequently, a first wafer had 33456 foreign matters in an area having a wafer size of 8 inches and a second wafer had 36091 foreign matters.

Next, a removing film on the cleaning layer side of the cleaning wafer for conveyance obtained as described above was removed and was conveyed into the substrate processing equipment having a wafer stage to which the 33456 foreign matters stuck. The conveyance could be carried out without a hindrance. Then, a brand-new silicon wafer having a size of 8 inches was conveyed with a mirror surface put on the underside and foreign matters having a size of 0.2 μm or more were measured through the laser type foreign matter measuring equipment. This operation was carried out five times and a ratio of foreign matter removal is shown in Table 1.

TABLE 1

| | Ratio of foreign matter removal | | | | |
|---|---|---|---|---|---|
| | 1 sheet conveyance | 2 sheets conveyance | 3 sheets conveyance | 4 sheets conveyance | 5 sheets conveyance |
| Second embodiment | 80% | 88% | 90% | 92% | 92% |

Comparative Example 2

A cleaning wafer for conveyance having a cleaning function was fabricated in the same manner as that in the second example except that a label sheet for cleaning obtained through punching into a circular shape having a diameter of 202 mm was used. The wafer was confirmed through a microscope and it was found that the label sheet for cleaning was protruded from the outer peripheral portion of the silicon wafer.

A separating film on the cleaning layer side of the cleaning wafer for conveyance was removed and was set onto a wafer cassette to be conveyed into a substrate processing equipment. Consequently, the protruded label sheet came in contact with the internal wall of the cassette and the cleaning wafer itself for conveyance was shifted from a regular position in the wafer cassette. Therefore, the conveyance could not be carried out. Accordingly, the conveyance using the cleaning wafer for conveyance was stopped.

Third Example

An adhesive solution of an ultraviolet curing type was prepared by uniformly mixing 50 parts by weight of polyethyleneglycol 200 dimethacrylate (produced by SHIN-NAKAMURA CHEMICAL CO., LTD: trade name of Nk Ester 4G), 50 parts by weight of urethane acrylate (produced by SHIN-NAKAMURA CHEMICAL CO., LTD: trade name of U-N-01), 3 parts by weight of polyisocyanate compound (produced by NIPPON POLYURETHANE INDUSTRY CO., LTD: trade name of Colonate L) and 3 parts by weight of benzyldimethyl ketal as a photopolymerization initiator (produced by CIBA SPECIALTY CHEMICALS K.K.: trade name of Irugacure-651) with 100 parts by weight of acryl based polymer (a weight average molecular weight of 700000) obtained by a monomer mixed solution containing 75 parts by weight of acrylic acid-2-ethylhexyl, 20 parts by weight of methyl acrylate and 5 parts by weight of acrylic acid.

Additionally, an ordinary adhesive solution was obtained in the same manner as described above except that the benzyldimethyl ketal was excluded from the adhesive.

The ordinary adhesive solution was coated to have a thickness of 10 µm after drying over the removed surface of a separator formed of an elongated polyester film (with a thickness of 38 µm and a width of 250 mm) having one surface treated with a silicone based remover. An elongated polyester film (with a thickness of 25 µm and a width of 250 mm) was then provided on the ordinary adhesive layer, and an adhesive solution of an ultraviolet curing type was coated over the polyolefin film to have a thickness of 40 µm after drying. Thus, an adhesive layer was provided as a cleaning layer, and a removing film formed of the elongated polyester film (with a thickness of 38 µm and a width of 250 mm), having one of surfaces treated with a silicone based remover, was bonded to the surface of the adhesive layer. Thus, a sheet was obtained.

Ultraviolet rays having a central wavelength of 365 nm were irradiated on the sheet with an integral light quantity of 1000 mJ/cm$^2$ so that a sheet for cleaning having a cleaning layer cured by the ultraviolet rays was obtained.

The top portion of the sheet (other than the separator) was punched to form a circle having a diameter of 200 mm, and an unnecessary part of the sheet was continuously separated and removed. Thus, the label sheet for cleaning according to the invention shown in FIG. 1 was fabricated. The processing of punching the cleaning sheet could be carried out without generation of adhesive roping and a cut refuse. After the fabrication, the label sheet was observed and it was found that the adhesive was not protruded from the end of the label and the label was not contaminated by the adhesive.

Moreover, the cleaning layer of the sheet for cleaning had a modulus of tensile elasticity of 49 N/mm$^2$ after the curing through the irradiation of the ultraviolet rays, that is, the sheet punching. The modulus of tensile elasticity was measured in accordance with a test method JIS K7127.

The label for cleaning was removed from the separator of the label sheet having a cleaning function thus obtained and was bonded to the back face (mirror surface) of a silicon wafer having a size of 8 inches with a hand roller. Thus, a cleaning wafer for conveyance having a cleaning function was fabricated.

By using the label sheet having a cleaning function, the label was bonded to the back face (mirror surface) of the silicon wafer having a size of 8 inches through a label tape bonding machine (produced by NITTO SEIKI INC.: trade name of NEL-GR3000). This operation was carried out continuously for 25 sheets. As a result, the sheet could be bonded to the wafer without a problem. Thus, a cleaning wafer for conveyance having a cleaning function could be fabricated. Moreover, the cleaning layer was bonded to the mirror surface of the silicon wafer with a width of 10 mm and a 180° peeling adhesion to the silicon wafer was measured in accordance with JIS Z0237. As a result, the 180° peeling adhesion to the silicon wafer was 0.078 N/10 mm.

On the other hand, foreign matters having a size of 0.2 µm or more were measured over the mirror surfaces of two brand-new silicon wafers having a size of 8 inches through a laser type foreign matter measuring equipment. Consequently, a first wafer had six foreign matters and a second wafer had five foreign matters. After the wafers are conveyed to a substrate processing equipment having separate electrostatic adsorbing mechanisms with the mirror surfaces put on the underside and the foreign matters having a size of 0.2 µm or more were measured through the laser type foreign matter measuring equipment. Consequently, a first wafer had 33456 foreign matters in an area having a wafer size of 8 inches and a second wafer had 36091 foreign matters.

Next, a removing film on the cleaning layer side of the cleaning wafer for conveyance obtained as described above was removed and was conveyed into the substrate processing equipment having a wafer stage to which the 33456 foreign matters stuck. The conveyance could be carried out without a hindrance. Then, a brand-new silicon wafer having a size of 8 inches was conveyed with a mirror surface put on the underside and foreign matters having a size of 0.2 µm or more were measured through the laser type foreign matter measuring equipment. This operation was carried out five times and a ratio of foreign matter removal is shown in Table 2.

TABLE 2

| | Ratio of foreign matter removal | | | | |
| --- | --- | --- | --- | --- | --- |
| | 1 sheet conveyance | 2 sheets conveyance | 3 sheets conveyance | 4 sheets conveyance | 5 sheets conveyance |
| Third embodiment | 80% | 88% | 90% | 92% | 92% |

Comparative Example 3

A cleaning sheet was fabricated in the same manner as that in the third example except that ultraviolet rays having a central wavelength of 365 nm were not irradiated on the cleaning sheet with an integral light quantity of 1000 mJ/cm$^2$. The sheet was cut through punching into a circular shape having a diameter of 200 mm in the same manner as that in the embodiment. Thus, a label sheet having a cleaning function was fabricated. In this case, since the cleaning layer was not cured, it served as a cushioning material. Consequently, a punching depth was not uniform so that a large number of punching defects of the label were generated. Moreover, the label thus fabricated was observed and it was found that an adhesive leaked out of the end of the label. Furthermore, many portions on the label were contaminated by the adhesive due to adhesive roping during the punching. In particular, moreover, the adhesive stuck onto a removing film around the cleaning layer side at the end of the label. After the label was fabricated, the ultraviolet rays having a central wavelength of 365 nm were irradiated with an integral light quantity of 1000 mJ/cm$^2$. However, the adhesive on the end of the label was not cured due to oxygen inhibition but had tackiness. Accordingly, the fabrication of a cleaning wafer for conveyance using the label sheet was stopped.

INDUSTRIAL APPLICABILITY

According to the cleaning sheet of the invention, as described above, conveyance in a substrate processing equipment can be carried out reliably and foreign matter sticking into the equipment can be removed easily and reliably. Furthermore, since sheet cutting is not required after bonding to a substrate, a working efficiency can be enhanced and a cut refuse is not generated.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of manufacturing a label sheet having a cleaning function, wherein the label sheet comprises a plurality of labels for cleaning, and,
    wherein the method comprises polymerizing and curing a curing type adhesive of a cleaning layer of each of the plurality of labels by irradiating the label sheet with active energy, and carrying out a sheet punching process for forming label shape after the polymerization and curing reaction of the adhesive of the cleaning layer,
    wherein the plurality of labels are continuously and removably provided on an elongated separator at intervals through an ordinary adhesive layer, and
    wherein each of said plurality of labels comprise a base material, the cleaning layer provided on one surface of the base material in a condition where the surface of the cleaning layer is protected by a removing film, and the ordinary adhesive layer is provided on another surface of the base material.

2. The method of manufacturing a label sheet having a cleaning function according to claim 1, wherein the curing type adhesive contains a pressure-sensitive adhesive polymer, a compound having one or more unsaturated double bonds in a molecule and a polymerization initiator with the active energy.

3. The method of manufacturing a label sheet having a cleaning function according to claim 2, wherein the pressure-sensitive adhesive polymer is an acryl based polymer containing, as a principal monomer, (meth)acrylic acid and/or a (meth)acrylic alkyl ester.

4. The method of manufacturing a label sheet having a cleaning function according to claim 2, wherein the polymerization initiator is a photopolymerization initiator, and the active energy is ultraviolet rays.

5. The method of manufacturing a label sheet having a cleaning function according to claim 1, wherein the cleaning layer has a modulus of tensile elasticity of 10 MPa or more (in accordance with JIS K7127) during the sheet punching process.

* * * * *